US012782183B2

(12) United States Patent
Nakamura

(10) Patent No.: US 12,782,183 B2
(45) Date of Patent: Nov. 3, 2026

(54) FLOW-RATE MONITORING DEVICE, FLOW-RATE MONITORING METHOD, AND COMPUTER-READABLE STORAGE MEDIUM

(71) Applicant: NEC Platforms, Ltd., Kawasaki (JP)

(72) Inventor: Yasuhito Nakamura, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 392 days.

(21) Appl. No.: 18/561,177

(22) PCT Filed: Mar. 17, 2022

(86) PCT No.: PCT/JP2022/012159
§ 371 (c)(1),
(2) Date: Nov. 15, 2023

(87) PCT Pub. No.: WO2022/244434
PCT Pub. Date: Nov. 24, 2022

(65) Prior Publication Data

US 2024/0280391 A1 Aug. 22, 2024

(30) Foreign Application Priority Data

May 21, 2021 (JP) ................................ 2021-086319

(51) Int. Cl.
*G01F 1/696* (2006.01)
*H05K 7/20* (2006.01)

(52) U.S. Cl.
CPC ......... *G01F 1/696* (2013.01); *H05K 7/20281* (2013.01)

(58) Field of Classification Search
CPC ............. H05K 7/20281; H05K 7/2029; H05K 7/20781; H05K 7/20745
See application file for complete search history.

(56) References Cited

U.S. PATENT DOCUMENTS

| | | | | |
|---|---|---|---|---|
| 9,632,549 | B2 * | 4/2017 | Kubota | H05K 7/20281 |
| 2004/0141542 | A1 * | 7/2004 | Sharma | H05K 7/20745 374/E7.042 |
| 2020/0064088 | A1 * | 2/2020 | Nakamura | H05K 7/20781 |

FOREIGN PATENT DOCUMENTS

| | | | |
|---|---|---|---|
| DE | 102013219789 | A1 | 4/2015 |
| EP | 2322865 | A1 | 5/2011 |

(Continued)

OTHER PUBLICATIONS

International Search Report for PCT Application No. PCT/JP2022/012159, mailed on Jun. 14, 2022.

(Continued)

*Primary Examiner* — Lam S Nguyen
(74) *Attorney, Agent, or Firm* — Sughrue Mion, PLLC

(57) ABSTRACT

An information processing device includes: one or more memories storing instructions; and one or more processors configured to execute the instructions to: acquire a calorific value of a first module, a first temperature that is a temperature of a heat generation member of the first module, and a second temperature that is a temperature of the heat generation member of a second module, wherein the first module and the second module are included in a plurality of modules mounted on an information processing device, and wherein the each module includes an electronic circuit board and a cooling member, and wherein a heat medium discharged from the cooling member of the first module is supplied to the second module; and estimate a flow rate of the heat medium supplied to the first module based on the calorific value of the first module, the first temperature, and the second temperature.

7 Claims, 11 Drawing Sheets

(56) References Cited

FOREIGN PATENT DOCUMENTS

| | | | |
|---|---|---|---|
| JP | H02-45715 | A | 2/1990 |
| JP | 2013-228300 | A | 11/2013 |
| JP | 2015-059465 | A | 3/2015 |
| JP | 2015-079843 | A | 4/2015 |
| JP | 2015-119599 | A | 6/2015 |
| WO | 2011/106024 | A1 | 9/2011 |
| WO | 2018/179158 | A1 | 10/2018 |
| WO | 2019/228759 | A1 | 12/2019 |
| WO | 2021/078456 | A1 | 4/2021 |

OTHER PUBLICATIONS

English translation of Written opinion for PCT Application No. PCT/JP2022/012159, mailed on Jun. 14, 2022.

European Search Report for EP Application No. 22804353.5, dated on Feb. 24, 2025.

* cited by examiner

FLOW-RATE MONITORING DEVICE, FLOW-RATE MONITORING METHOD, AND COMPUTER-READABLE STORAGE MEDIUM

This application is a National Stage Entry of PCT/JP2022/012159 filed on Mar. 17, 2022, which claims priority from Japanese Patent Application 2021-086319 filed on May 21, 2021, the contents of all of which are incorporated herein by reference, in their entirety.

TECHNICAL FIELD

The present disclosure relates to a technique for monitoring a flow rate of a target.

BACKGROUND ART

There is a technique for cooling an electronic device including a heat generation member using a heat medium. For example, PTL 1 discloses a technique for cooling a semiconductor element by bringing a heat sink, which is a cooling member, into contact with a module including the semiconductor element, which is a heat generation member, via a metal base and allowing cooling water to flow through the heat sink.

Here, if the heat medium does not appropriately flow, there is a possibility that the heat generation member cannot be cooled. Therefore, whether the heat medium flowing through the cooling member flows properly is monitored. For example, PTL 2 discloses a technique for measuring a temperature of a heat medium, a temperature of a heat generation member, and a calorific value of the heat generation member for an electronic device including the heat generation member, and calculating a flow rate of the heat medium from these pieces of information.

As a related document, PTL 3 discloses a technique for measuring the speed of the heat medium from information such as an increase amount of the temperature of the sensor under a specific condition and when various kinds of information such as characteristics of the heat medium and a structure of the device are known.

CITATION LIST

Patent Literature

PTL 1: JP 2015-119599 A
PTL 2: JP 2015-079843 A
PTL 3: JP 2-045715 A

SUMMARY OF INVENTION

Technical Problem

A plurality of electronic devices including a heat generation member and a cooling member may be installed in one device. At this time, if the flow path is provided so as to independently supply the heat medium to each of the electronic devices from the outside of the device including the electronic device, the electronic device and the device including the electronic device may be increased in size. Therefore, for example, the flow path of the heat medium may be designed such that the heat medium is supplied to one electronic device and the heat medium discharged from one electronic device is supplied to another electronic device. In such a case, when the flowmeter is installed to monitor the flow rate of the heat medium, it is necessary to install the flowmeter for each flow path, and thus there is a possibility that the electronic device and the device including the electronic device become large in size. In a case where components in the electronic device are disposed at a high density, it is difficult to install the flowmeter.

In the technique of PTL 2, the flow rate of the heat medium is calculated from various types of information without using a flowmeter. However, in the technique of PTL 2, it is necessary to install all the sensors that measure the temperature of the heat medium, the temperature of the heat generation member, and the calorific value of the heat generation member, and thus there is a possibility that the electronic device and the device including the electronic device become large in size.

PTL 3 does not describe monitoring the heat medium in the above-described case.

The present disclosure has been made in view of the above problems, and one of the purposes of the present disclosure is to provide a flow-rate monitoring device, etc. that make it possible to monitor the flow rate of a heat medium for cooling a heat generation member, while moderating an increase in the size of an appliance in which the heat generation member is installed.

Solution to Problem

A device according to an aspect of the present disclosure is a flow-rate monitoring device including an acquisition means that acquires, in an information processing device having mounted with a plurality of modules, each of which including an electronic circuit board including a heat generation member and a cooling member that receives heat from the heat generation member and cools the heat generation member by utilizing a heat medium, when the heat medium discharged from the cooling member of a first module among the plurality of modules is supplied to a second module among the plurality of modules, a calorific value of the first module, a first temperature that is a temperature of the heat generation member of the first module, and a second temperature that is a temperature of the heat generation member of the second module, and an estimation means that estimates a flow rate of the heat medium supplied to the first module based on a calorific value of the first module, the first temperature, and the second temperature.

A flow-rate monitoring device according to an aspect of the present disclosure includes an acquisition means that acquires a calorific value of a module including an electronic circuit board including a heat generation member and a cooling member that receives heat from the heat generation member and cools the heat generation member by using a heat medium, a supply temperature that is a temperature of the heat medium supplied to the cooling member, and a discharge temperature that is a temperature of the heat medium discharged from the cooling member, and an estimation means that estimates a flow rate of the heat medium supplied to the module based on the calorific value, the supply temperature, and the discharge temperature.

A flow-rate monitoring method according to an aspect of the present disclosure includes acquiring, in an information processing device having mounted with a plurality of modules, each of which including an electronic circuit board including a heat generation member and a cooling member that receives heat from the heat generation member and cools the heat generation member by utilizing a heat medium, when the heat medium discharged from the cooling member of a first module among the plurality of modules is supplied to a second module among the plurality of modules, a calorific value of the first module, a first temperature that is a temperature of the heat generation member of the first module, and a second temperature that is a temperature of the heat generation member of the second module, and estimating a flow rate of the heat medium supplied to the first module based on a calorific value of the first module, the first temperature, and the second temperature.

A computer-readable storage medium according to an aspect of the present disclosure stores a program causing a computer to execute acquiring, in an information processing device having mounted with a plurality of modules, each of which including an electronic circuit board including a heat generation member and a cooling member that receives heat from the heat generation member and cools the heat generation member by utilizing a heat medium, when the heat medium discharged from the cooling member of a first module among the plurality of modules is supplied to a second module among the plurality of modules, a calorific value of the first module, a first temperature that is a temperature of the heat generation member of the first module, and a second temperature that is a temperature of the heat generation member of the second module, and estimating a flow rate of the heat medium supplied to the first module based on a calorific value of the first module, the first temperature, and the second temperature.

Advantageous Effects of Invention

According to the present disclosure, it is possible to monitor a flow rate of a heat medium for cooling a heat generation member while suppressing an increase in size of a device on which the heat generation member is mounted.

EXAMPLE EMBODIMENT

Hereinafter, example embodiments of the present disclosure will be described with reference to the drawings.

First Example Embodiment

An outline of a flow-rate monitoring device according to a first example embodiment will be described.

Figure 1:
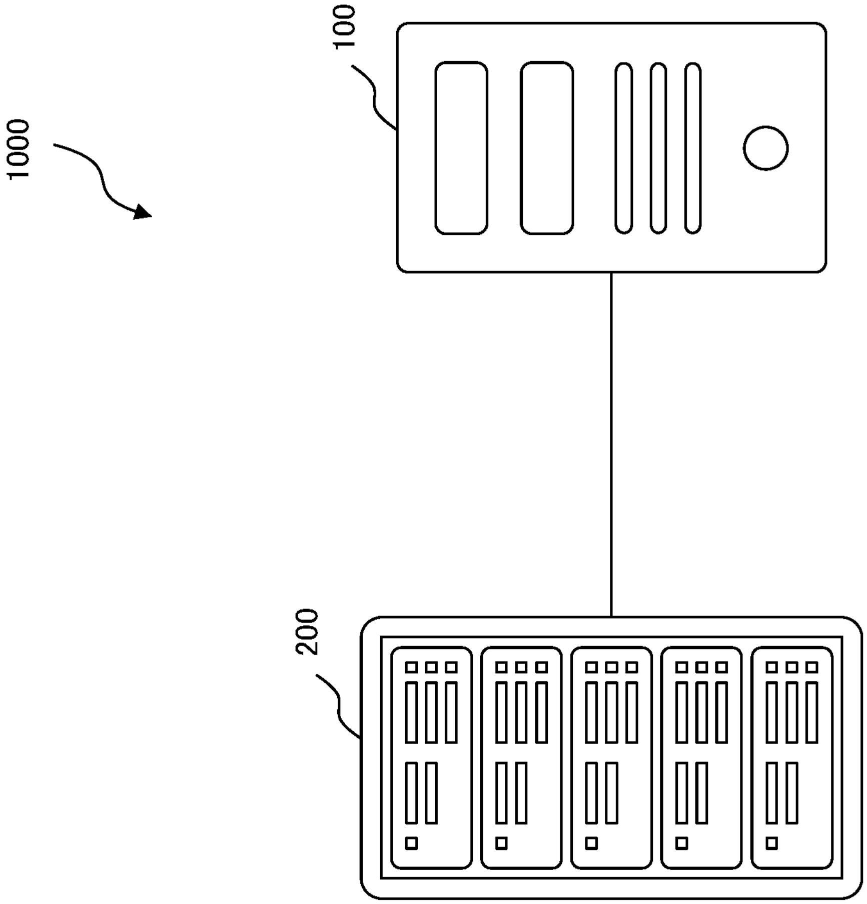
FIG. 1 is a diagram schematically illustrating an example of a configuration of a flow-rate monitoring system according to a first example embodiment of the present disclosure.

FIG. 1 is a diagram schematically illustrating an example of a configuration of a flow-rate monitoring system 1000. As illustrated in FIG. 1, the flow-rate monitoring system 1000 includes a flow-rate monitoring device 100 and an information processing device 200. The flow-rate monitoring device 100 and the information processing device 200 are communicably connected. In the present disclosure, an example in which the flow-rate monitoring device 100 is a device different from the information processing device 200 will be described, but the flow-rate monitoring device 100 and the information processing device 200 may be an integrated device.

Figure 2:
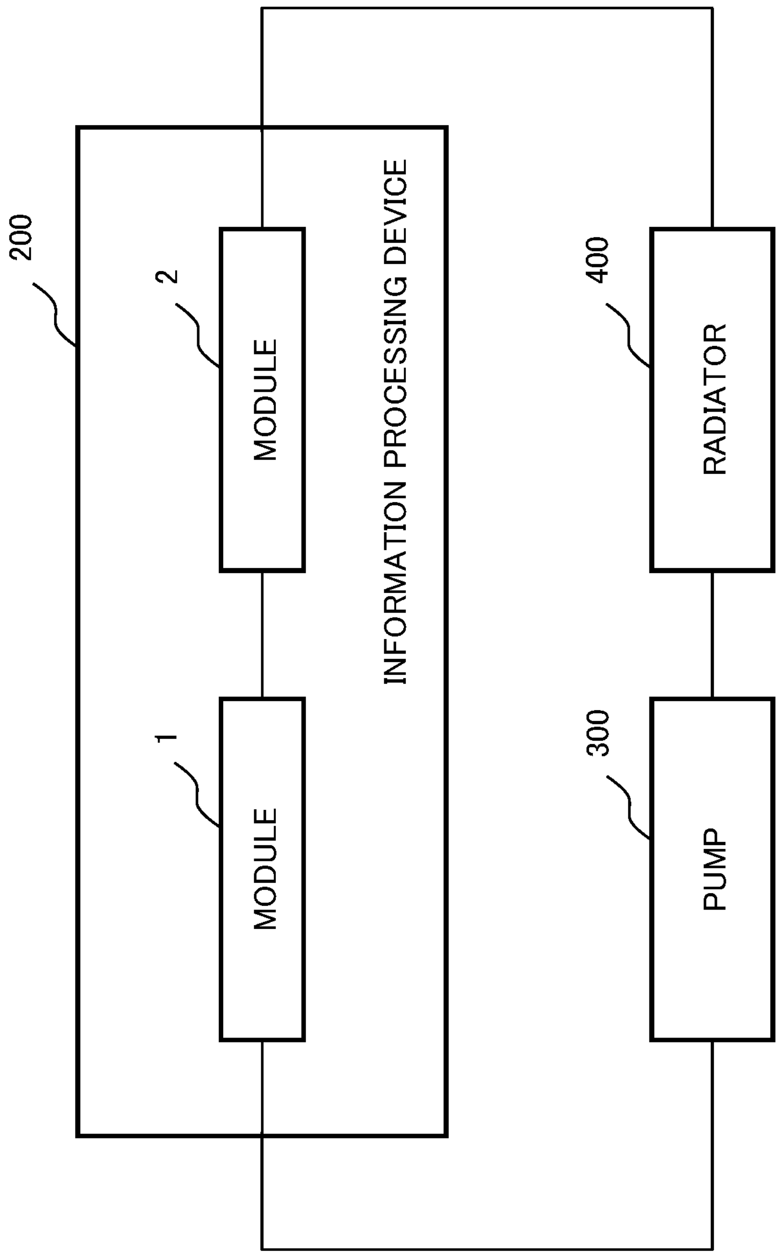
FIG. 2 is a cross-sectional view illustrating an example of a configuration of an information processing device according to the first example embodiment of the present disclosure.

FIG. 2 is a block diagram including an example of a configuration of the information processing device 200. The information processing device 200 includes a plurality of modules. The module is, for example, an electronic device including: an electronic circuit board including a heat generation member; and a cooling member that receives heat from the heat generation member and cools the heat generation member by using a heat medium. The heat generation member is, for example, a control processing unit (CPU), a memory, and the like, but is not limited to this example.

In the example of FIG. 2, modules 1 and 2 are mounted on the information processing device 200. The modules 1 and 2 are also referred to as a first module and a second module. The modules 1 and 2 are the same device.

The information processing device 200 is connected to a pump 300 and a radiator 400 via a pipe. Here, a line connecting each block in FIG. 2 indicates a pipe. The heat medium passes through the pipe. The heat medium is, for example, a liquid, and may be referred to as cooling water. The heat medium cooled by the radiator 400 is supplied to the information processing device 200 through piping by the pump 300. The heat medium sequentially flows through the cooling member of the module 1 and the cooling member of the module 2 in the information processing device 200, cools the heat generation member included in each module, and is discharged to the outside of the information processing device 200. The discharged heat medium flows into the radiator 400 via the pipe. In this manner, the heat generation member in the information processing device 200 is cooled. A state in which the modules are connected by piping such that the heat medium discharged from one module is directly supplied to another module as in the modules 1 and 2 in FIG.

2 is expressed as "the modules are connected in series". A group of modules connected in series is referred to as an electronic device array. Two or more modules may be mounted on the information processing device 200. That is, the electronic device array may be one in which three or more modules are connected in series, or a plurality of electronic device arrays may be installed in the information processing device 200.

Figure 3:
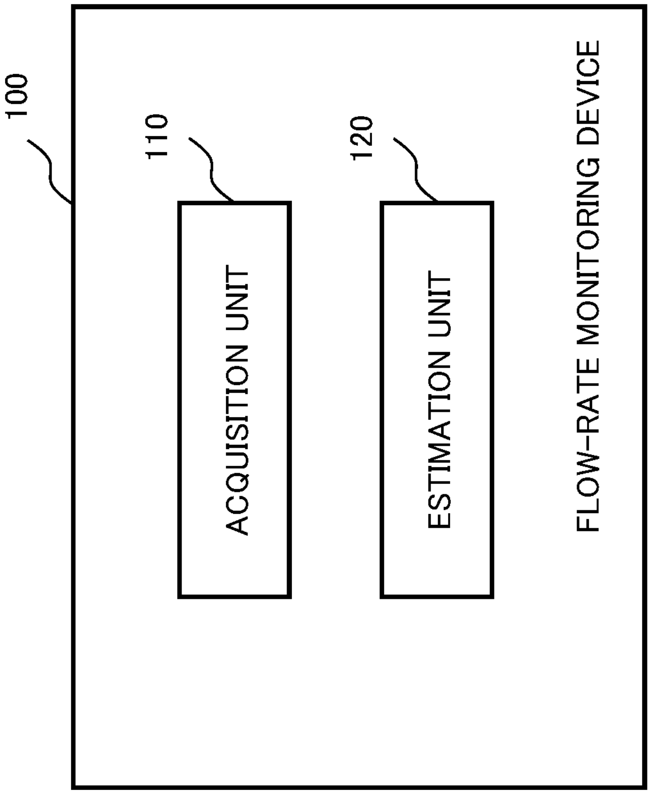
FIG. 3 is a block diagram illustrating an example of a functional configuration of a flow-rate monitoring device according to the first example embodiment of the present disclosure.

FIG. 3 is a block diagram illustrating an example of a configuration of the flow-rate monitoring device 100. As illustrated in FIG. 3, the flow-rate monitoring device 100 includes an acquisition unit 110 and an estimation unit 120.

The acquisition unit 110 acquires a calorific value of the first module, a first temperature that is a temperature of the heat generation member of the first module, and a second temperature that is a temperature of the heat generation member of the second module. For example, the acquisition unit 110 acquires the temperature of the heat generation member from a sensor that is mounted on each of the module 1 and the module 2 and measures the temperature. The temperature of the heat generation member may be, for example, a junction temperature of the heat generation member. The acquisition unit 110 acquires the calorific value of the module 1 from, for example, a sensor mounted on the module 1. Here, the calorific value is a physical quantity whose unit is W (watt). For example, the acquisition unit 110 acquires, as a calorific value, information on power generated in the module 1 measured by a sensor mounted on the module 1. The acquisition unit 110 is an example of an acquisition means.

The estimation unit 120 estimates the flow rate of the heat medium supplied to the first module based on the calorific value, the first temperature, and the second temperature. For example, according to the law of conservation of heat quantity, the calorific value of the module 1 can be obtained from the density and specific heat of the heat medium, the flow rate of the heat medium, and the difference between the temperature of the heat medium supplied to the module 1 and the temperature of the heat medium supplied from the module 1 to the module 2. Here, the difference between the temperature of the heat medium supplied to the module 1 and the temperature of the heat medium supplied from the module 1 to the module 2 can be approximated to the difference between the temperature of the heat generation member of the module 1 and the temperature of the heat generation member of the module 2. For example, the estimation unit 120 may estimate the flow rate of the heat medium supplied to the module 1 using such a relationship. However, the estimation unit 120 is an example of an estimation means.

Next, an example of the operation of the flow-rate monitoring device 100 will be described with reference to FIG. 4. In the present disclosure, each step of the flowchart is expressed using a number assigned to each step, such as "S1".

Figure 4:
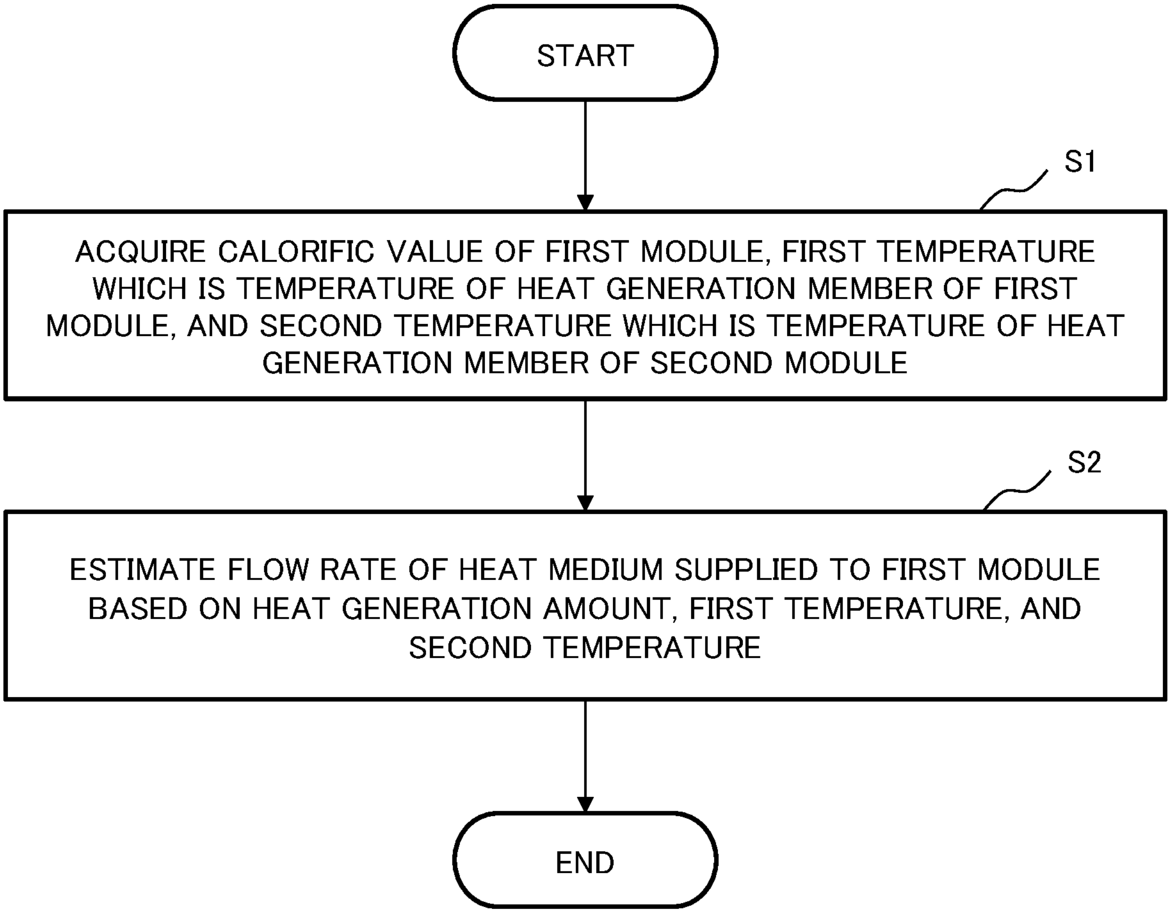
FIG. 4 is a flowchart for explaining an example of operation of the flow-rate monitoring device according to the first example embodiment of the present disclosure.

FIG. 4 is a flowchart illustrating an example of the operation of the flow-rate monitoring device 100. The acquisition unit 110 acquires a calorific value of the first module, a first temperature that is a temperature of the heat generation member of the first module, and a second temperature that is a temperature of the heat generation member of the second module (S1). Then, the estimation unit 120 estimates the flow rate of the heat medium supplied to the first module based on the calorific value, the first temperature, and the second temperature (S2).

As described above, the flow-rate monitoring device 100 of the present disclosure acquires the calorific value of the first module, the first temperature that is the temperature of the heat generation member of the first module, and the second temperature that is the temperature of the heat generation member of the second module, and estimates the flow rate of the heat medium supplied to the first module based on the calorific value, the first temperature, and the second temperature. That is, the flow-rate monitoring device 100 of the present disclosure can calculate the flow rate as long as the information on the calorific value and the temperature can be obtained from the electronic device. Therefore, in order to calculate the flow rate, a sensor other than the sensor that measures the calorific value and the temperature may not be attached to the electronic device. That is, the flow-rate monitoring device 100 of the present disclosure can monitor the flow rate of the heat medium for cooling the heat generation member while suppressing an increase in size of the device on which the heat generation member is mounted.

[Details of Flow-Rate Monitoring System 1000]

Next, details of the flow-rate monitoring system 1000 including the flow-rate monitoring device 100 of the present disclosure will be described.

[Details of Information Processing Device 200]

Figure 5:
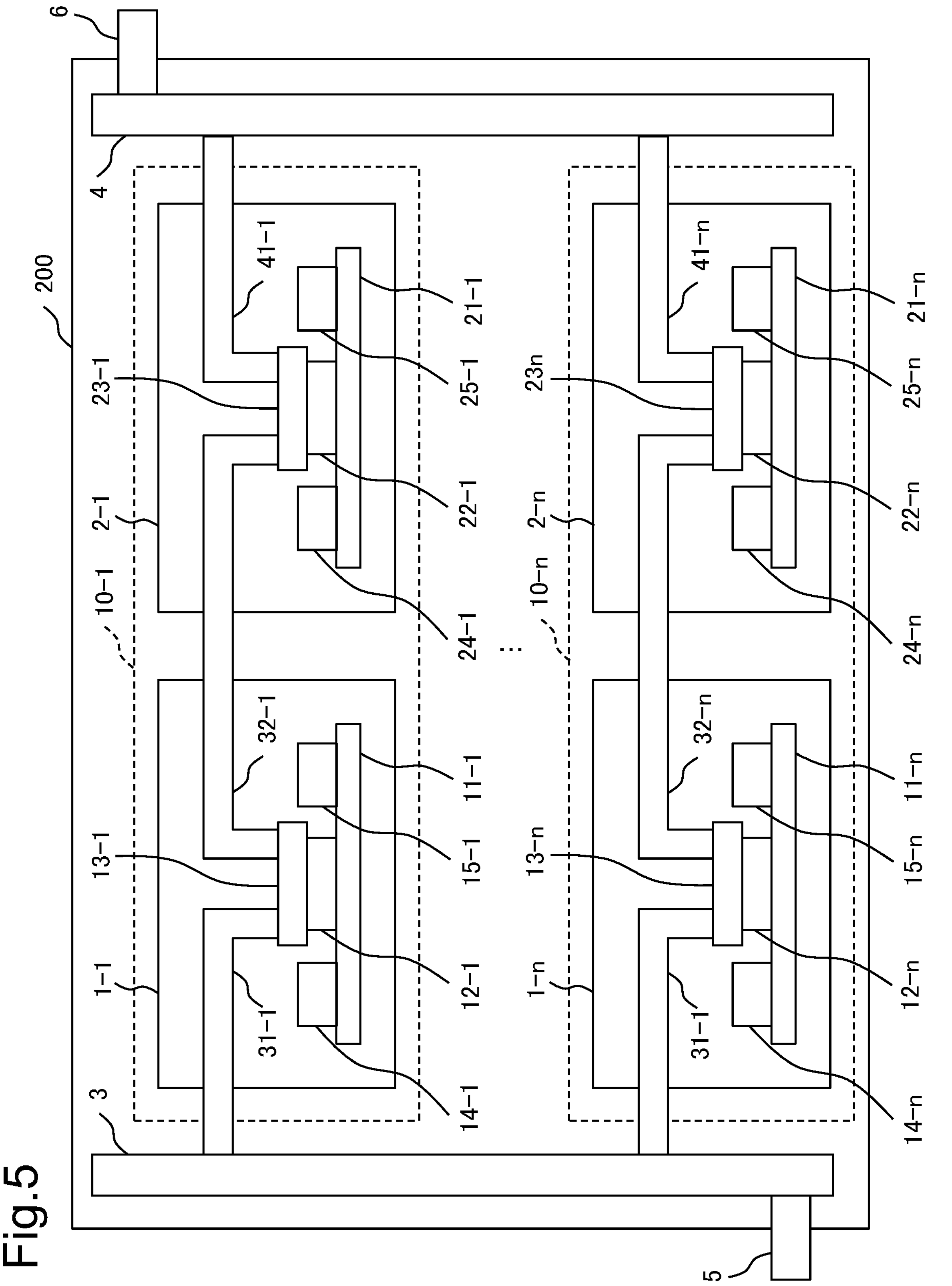
FIG. 5 is a cross-sectional view illustrating another example of the configuration of the information processing device according to the first example embodiment of the present disclosure.

FIG. 5 is a cross-sectional view illustrating another example of the configuration of the information processing device 200 in FIG. 1. In the example of FIG. 5, the information processing device 200 is equipped with electronic device arrays 10-1, 10-2, . . . , and **10-*n* (n is an integer of 1 or more). For example, the electronic device array 10-1 includes a module 1-1 and a module 2-1. The module 1-1 includes an electronic circuit board 11-1, a heat generation member 12-1, a cooling member 13-1, a power measurement unit 14-1, and a temperature measurement unit 15-1. The module 2-1 includes an electronic circuit board 21-1, a heat generation member 22-1, a cooling member 23-1, a power measurement unit 24-1, and a temperature measurement unit 25-1**.

The information processing device 200 is connected to the pump 300 and the radiator 400 via connection pipes 5 and 6. For example, the heat medium supplied from the pump passes through the connection pipe 5 and flows into a distribution pipe 3. The distribution pipe 3 is connected to supply pipes 31-1, 31-2, . . . , **31-*n*. That is, the distribution pipe 3 distributes the heat medium to each of the supply pipes 31-1, 31-2, . . . , 31-*n*. Accordingly, the heat medium can be distributed to each of the electronic device arrays 10-1, 10-2, . . . , 10-*n*. Here, when the electronic device arrays 10-1, 10-2, . . . , and 10-*n* are not distinguished, they are simply referred to as the electronic device array 10. In the present disclosure, similarly to the electronic device array 10, in a case where configurations to which reference signs of x-n (x is an integer) are attached are not distinguished, the reference signs attached to the configurations are denoted only as x. For example, the electronic device array 10 includes the module 1 and the module 2, and the module 1 includes an electronic circuit board 11, a heat generation member 12, a cooling member 13, a power measurement unit 14, and a temperature measurement unit 15**.

The heat medium passing through the supply pipe 31 is supplied to the cooling member 13. Here, the cooling member 13 is disposed on the heat generation member 12. The cooling member 13 receives heat from the heat generation member 12. The cooling member 13 causes the heat medium flowing into the cooling member 13 to receive the heat taken from the heat generation member 12. The cooling member 13 cools the heat generation member 12 by using the heat medium in this manner. The heat medium discharged from the cooling member 13 passes through an intermediate pipe 32 and is supplied to the cooling member 23. Similarly to the cooling member 13, the cooling member 23 cools the heat generation member 22 using the heat medium flowing through the cooling member 23. The heat medium discharged from the cooling member 23 passes through a discharge pipe 41 and flows into a junction pipe 4. The junction pipe 4 is connected to discharge pipes 41-1, 41-2, . . . , 41-*n*. That is, the junction pipe 4 joins the heat medium having passed through each of the electronic device arrays 10. The junction pipe 4 is connected to a connection pipe 6. That is, the heat medium discharged from each of the electronic device arrays 10 flows through the connection pipe 6. The heat medium flowing through the connection pipe 6 flows into the radiator 400.

The power measurement units 14 and 24 measure the power of the module. For example, the power measurement unit 14 measures power generated in the module 1. The timing of measuring power is arbitrary. For example, the power measurement units 14 and 24 may perform measurement at regular intervals or may perform measurement constantly. The temperature measurement units 15 and 25 measure the temperature of the heat generation member of the module. For example, the temperature measurement unit 15 measures the temperature of the heat generation member 12 of the module 1. The temperature of the heat generation member 12 of the module 1 is also referred to as a first temperature, and the temperature of the heat generation member 22 of the module 2 is also referred to as a second temperature. The temperature is measured at any timing. For example, the temperature measurement units 15 and 25 may perform measurement at regular intervals or may perform measurement constantly. The measurement timings of the power measurement units 14 and 24 and the measurement timings of the temperature measurement units 15 and 25 may be the same.

[Details of Flow-Rate Monitoring Device 100]

Figure 6:
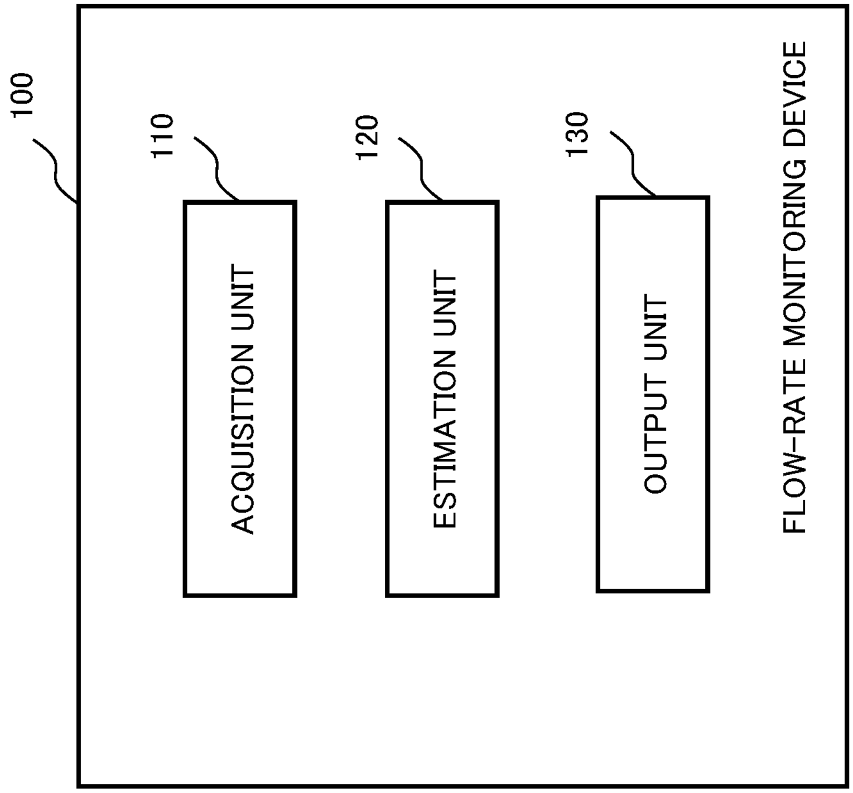
FIG. 6 is a block diagram illustrating another example of the functional configuration of the flow-rate monitoring device according to the first example embodiment of the present disclosure.

FIG. 6 is a block diagram illustrating another example of the functional configuration of the flow-rate monitoring device 100. As illustrated in FIG. 6, the flow-rate monitoring device 100 may include an output unit 130 in addition to the acquisition unit 110 and the estimation unit 120.

The acquisition unit 110 acquires a calorific value and the first temperature that is the temperature of the heat generation member 12 from each of the modules 1. The acquisition unit 110 acquires the second temperature, which is the temperature of the heat generation member 22, from each of the modules 2.

The estimation unit 120 estimates the flow rate of the heat medium flowing into each of the modules 1 based on the information acquired by the acquisition unit 110, that is, the flow rate of the heat medium flowing through the electronic device array 10 for each of the electronic device arrays 10. Here, an example of a method of estimating the flow rate of the heat medium will be described.

Let the calorific values of the modules 1 and 2 be P(W), the first temperature be $T_{j1}$(° C.), and the second temperature be $T_{j2}$(° C.). Assuming that the temperature of the heat medium supplied to the cooling member 13 is $T_{w1}$(° C.), the temperature of the heat medium supplied to the cooling member 23 is $T_{w2}$(° C.), and the thermal resistance between $T_{w1}$ and $T_{w2}$ is $\theta_{jw}$(° C./W), the difference ΔT between the temperature of the heat generation member and the temperature of the heat medium can be expressed as follows.

$$\Delta T = \theta_{jw} \times P \quad \text{[Math. 1]}$$

Here, when Expression 1 is used, the first temperature $T_{j1}$ and the second temperature $T_{j2}$ can be expressed as Expression 2 and Expression 3.

$$T_{j1} = T_{w1} + \theta_{jw} \times P \quad \text{[Math. 2]}$$

$$T_{j2} = T_{w2} + \theta_{jw} \times P \quad \text{[Math. 3]}$$

Then, Expression 2 is subtracted from Expression 3 to be expressed as Expression 4.

$$T_{j2} - T_{j1} = T_{w2} - T_{w1}. \quad \text{[Math. 4]}$$

The flow rate of the heat medium supplied to the module 1 is L (L/min). When the density of the heat medium is ρ (g/cm3), the specific heat of the heat medium is c (cal/g·° C.), and the constant is k, the following equation is derived from the law of conservation of heat quantity.

$$P = k \times \rho \times c \times L \times (T_{w2} - T_{w1}) \quad \text{[Math. 5]}$$

When Expression 4 is substituted into Expression 5, Expression 6 is derived. Then, the flow rate L is calculated as Expression 7.

$$P = k \times \rho \times c \times L \times (T_{j2} - T_{j1}) \quad \text{[Math. 6]}$$

$$L = P/(k \times \rho \times c \times (T_{j2} - T_{j1})) \quad \text{[Math. 7]}$$

The estimation unit 120 estimates the flow rate of the heat medium supplied to the module 1 using, for example, Expression 7.

The output unit 130 outputs the flow rate estimated by the estimation unit 120. For example, the output unit 130 may store information indicating each of the electronic device arrays 10 and a flow rate estimated for each of the electronic device arrays 10 in association with each other in a storage device (not illustrated) connected to the flow-rate monitoring device 100. At this time, information indicating each of the modules may be further associated and stored. For example, the output unit 130 may cause a display (not illustrated) connected to the flow-rate monitoring device 100 to display information in which information indicating each of the electronic device arrays 10 is associated with a flow rate estimated for each of the electronic device arrays 10.

The output unit 130 may output an alarm when there is the electronic device array 10 having a flow rate less than the predetermined threshold. For example, the output unit 130 may cause the display to highlight information indicating the electronic device array 10 having a flow rate less than the predetermined threshold and the flow rate. Not limited to this example, the output unit 130 may cause a speaker (not illustrated) connected to the flow-rate monitoring device 100 to output a sound or may perform control to turn on a lamp (not illustrated) connected to the flow-rate monitoring device 100 when there is the electronic device array 10 having a flow rate less than a predetermined threshold.

[Operation of Flow-Rate Monitoring Device 100]

Figure 7:
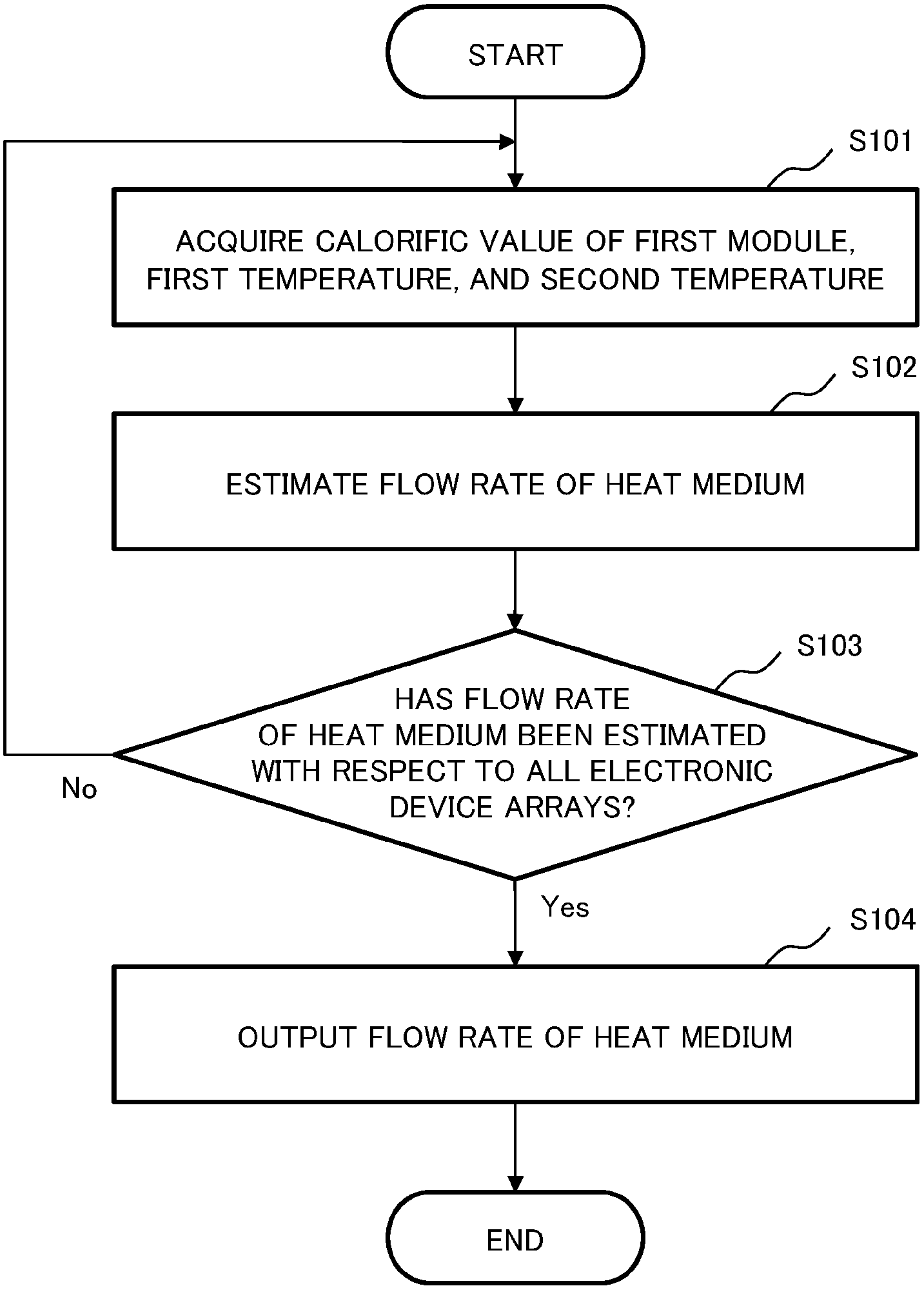
FIG. 7 is a flowchart for explaining another example of the operation of the flow-rate monitoring device according to the first example embodiment of the present disclosure.

Next, another example of the operation of the flow-rate monitoring device 100 will be described with reference to FIG. 7.

First, the acquisition unit 110 acquires the calorific value of the first module (that is, the module 1), the first temperature, and the second temperature (S101). Then, the estimation unit 120 estimates the flow rate of the heat medium supplied to the electronic device array 10 (S102). When the flow rate of the heat medium is not estimated for all the electronic device arrays 10 ("No" in S103), the processes in S101 and S102 are performed for the electronic device array 10 for which the flow rate is not estimated. When the flow rate of the heat medium is estimated for all the electronic device arrays 10 ("Yes" in S103), the output unit 130 outputs the flow rate of the heat medium (S104). In the present operation example, the flow-rate monitoring device 100 outputs the flow rate after the flow rate of the heat medium is estimated for all the electronic device arrays 10, but the timing of outputting the flow rate is not limited to this example. For example, the flow-rate monitoring device 100 may output the flow rate after S102, and then perform the process of S103. That is, the flow-rate monitoring device 100 may output the flow rate every time the flow rate is estimated.

As described above, the flow-rate monitoring device 100 of the first example embodiment acquires the calorific value of the first module, the first temperature that is the temperature of the heat generation member of the first module, and the second temperature that is the temperature of the heat generation member of the second module, and estimates the flow rate of the heat medium supplied to the first module based on the calorific value, the first temperature, and the second temperature. Accordingly, in order to calculate the flow rate, measurement devices other than the power measurement unit and the temperature measurement unit may not be attached to each module. That is, the flow-rate monitoring device 100 of the present disclosure can monitor the flow rate of the heat medium for cooling the heat generation member while suppressing an increase in size of the device on which the heat generation member is mounted.

Modification 1

In the first example embodiment, the example in which the power measurement unit is mounted on all the modules has been described, but the present invention is not limited to this example. When each module is the same device, the power generated in each module is considered to be similar. Therefore, in each of the electronic device arrays 10, at least one module may be configured to include the power measurement unit. In this case, the acquisition unit 110 may set the calorific value acquired from the module on which the power measurement unit is mounted as the calorific value of the first module in each of the electronic device arrays 10. In this manner, the acquisition unit 110 may acquire the calorific value acquired from either the first module or the second module as the calorific value of the first module used by the estimation unit 120.

Modification 2

Figure 8:
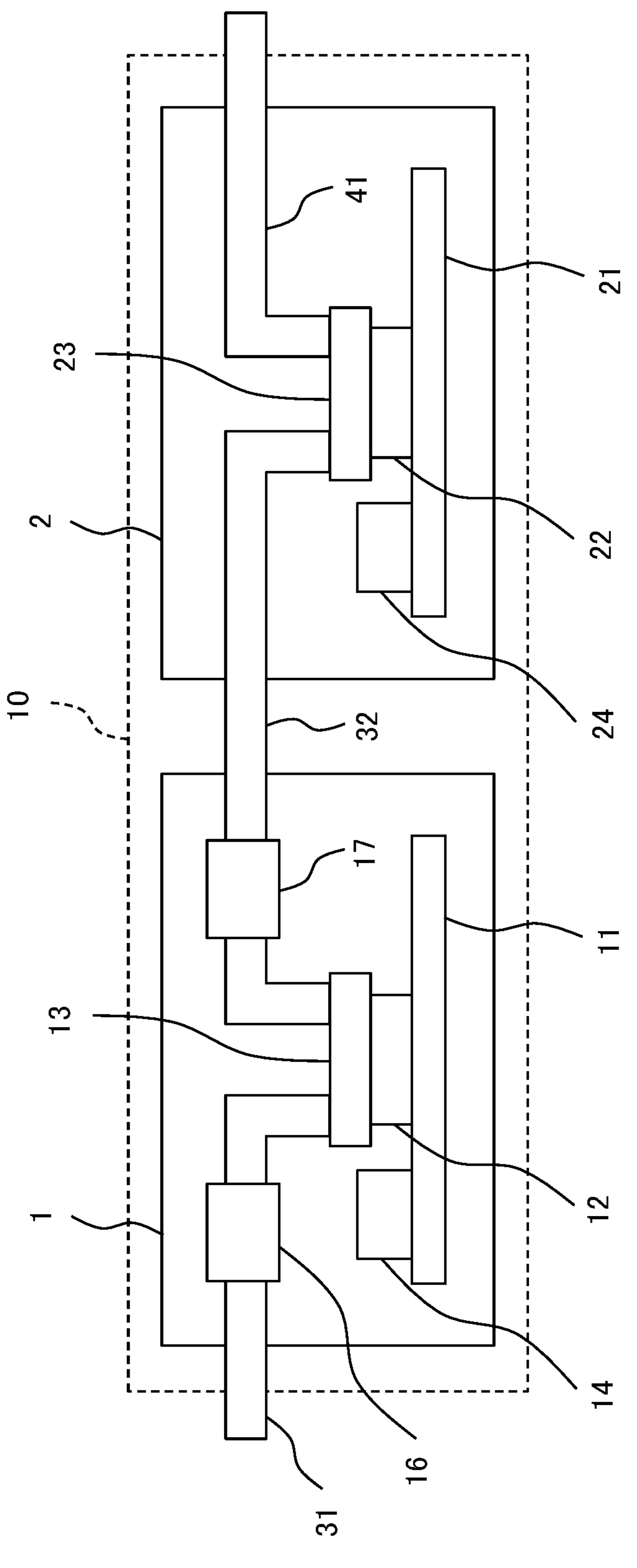
FIG. 8 is a cross-sectional view illustrating an example of a configuration of an electronic device array according to a second modification of the present disclosure.

The configuration of the electronic device array 10 is not limited to the example illustrated in FIG. 5. FIG. 8 is a cross-sectional view illustrating a configuration of electronic device array 10 according to Modification 2. The modules 1 and 2 in FIG. 8 are not equipped with a temperature measurement unit. Instead, a liquid temperature measurement unit 16 is installed in the supply pipe 31, and a liquid temperature measurement unit 17 is installed in the intermediate pipe 32. The liquid temperature measurement unit 16 measures the temperature of the heat medium passing through the supply pipe 31. That is, the liquid temperature measurement unit 16 measures the temperature $T_{w1}$ of the heat medium supplied to the cooling member 13. The liquid temperature measurement unit 17 measures the temperature of the heat medium passing through the intermediate pipe 32. That is, the liquid temperature measurement unit 17 measures the temperature of the heat medium discharged from the cooling member 13, in other words, the temperature $T_{w2}$ of the heat medium supplied to the cooling member 23. Here, the temperature of the heat medium supplied to the cooling member 13 is referred to as a supply temperature, and the temperature of the heat medium discharged from the cooling member 13 is referred to as a discharge temperature.

In Modification 2, the acquisition unit 110 acquires the supply temperature $T_{w1}$ and the discharge temperature $T_{w2}$ instead of the first temperature $T_{j1}$ and the second temperature $T_{j2}$.

At this time, the estimation unit 120 estimates the flow rate L based on the calorific value P and $T_{w1}$ and $T_{w2}$. Specifically, the estimation unit 120 calculates L using Expression 8 obtained by modifying Expression 5.

$$L = P/(k\times\rho\times c\times(T_{w2}-T_{w1})) \quad \text{[Math. 8]}$$

As described above, the flow-rate monitoring device 100 of Modification 2 acquires the calorific value of the module including the electronic circuit board including the heat generation member and the cooling member that receives heat from the heat generation member and cools the heat generation member by using the heat medium, the supply temperature that is the temperature of the heat medium supplied to the cooling member, and the discharge temperature that is the temperature of the heat medium discharged from the cooling member. Then, the flow-rate monitoring device 100 estimates the flow rate of the heat medium supplied to the module based on the calorific value, the supply temperature, and the discharge temperature. With this configuration, the flow-rate monitoring device 100 of Modification 2 has the same effect as the flow-rate monitoring device 100 described in the first example embodiment.

That is, the flow-rate monitoring device 100 of Modification 2 can monitor the flow rate of the heat medium for cooling the heat generation member while suppressing an increase in size of the device on which the heat generation member is mounted.

Second Example Embodiment

Next, a flow-rate monitoring system according to a second example embodiment will be described. In the second example embodiment, description of contents overlapping with the contents described in the first example embodiment will be partially omitted.

Figure 9:
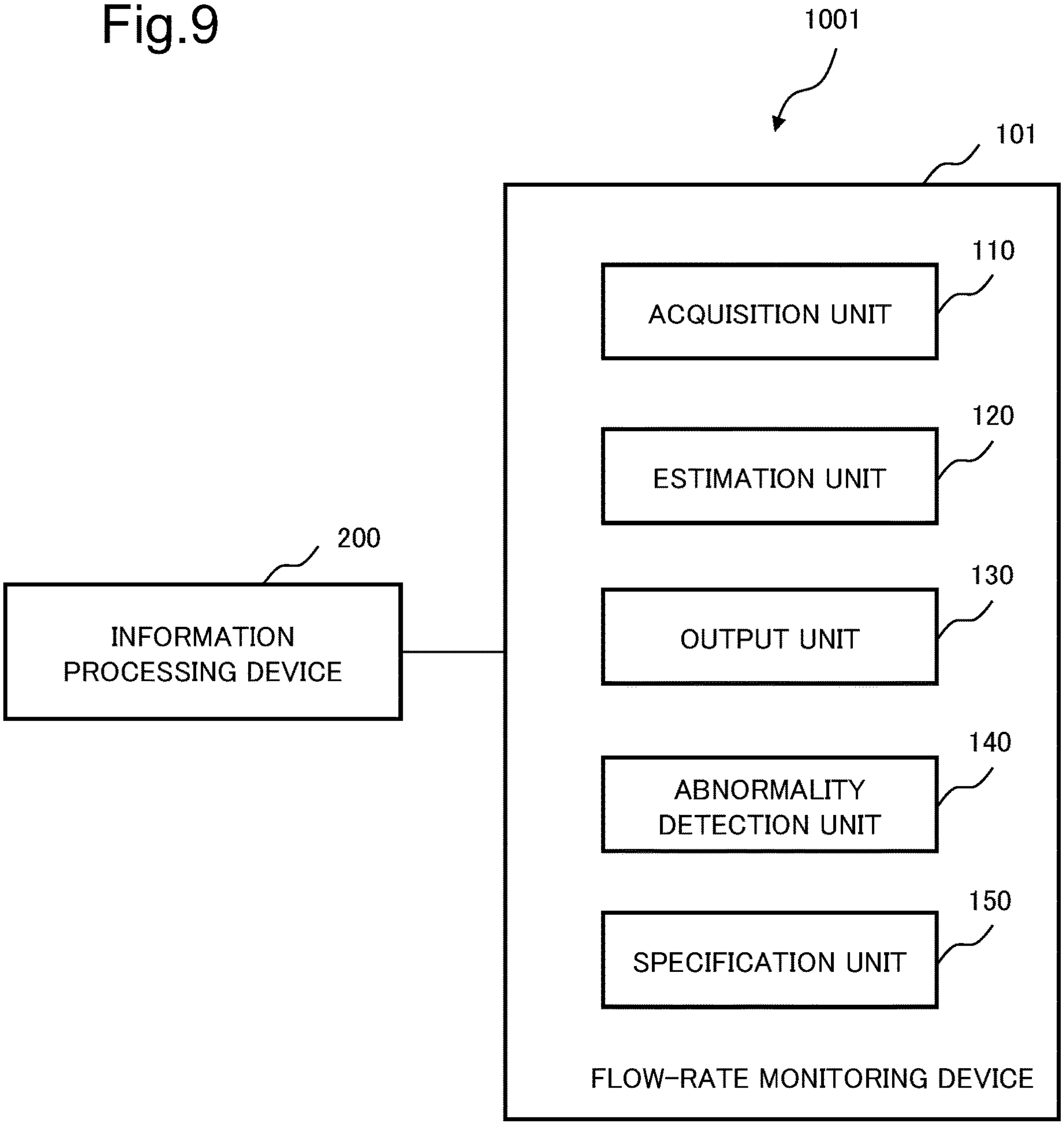
FIG. 9 is a block diagram illustrating an example of a functional configuration of a flow-rate monitoring system according to a second example embodiment of the present disclosure.

FIG. 9 is a block diagram illustrating an example of a configuration of a flow-rate monitoring system 1001 of the second example embodiment. As illustrated in FIG. 9, the flow-rate monitoring system 1001 includes a flow-rate monitoring device 101 instead of the flow-rate monitoring device

100 in the flow-rate monitoring system 1000 of FIG. 1. That is, the flow-rate monitoring system 1001 includes the flow-rate monitoring device 101 and the information processing device 200.

The flow-rate monitoring device 101 includes an acquisition unit 110, an estimation unit 120, an output unit 130, an abnormality detection unit 140, and a specification unit 150.

The abnormality detection unit 140 detects occurrence of an abnormality based on the flow rate of the heat medium estimated by the estimation unit 120. For example, the abnormality detection unit 140 determines whether the estimated flow rate is a flow rate less than a predetermined threshold. Then, in a case where the estimated flow rate is less than the predetermined threshold, the abnormality detection unit 140 detects that an abnormality has occurred in the electronic device array 10. The abnormality detection unit 140 is an example of an abnormality detection means.

The method of detecting the abnormality is not limited to this example. For example, in a case where a plurality of the electronic device arrays 10 are mounted on the information processing device 200, the abnormality detection unit 140 compares the flow rates relevant to the electronic device arrays. Then, the abnormality detection unit 140 detects an abnormality when the flow rate of the heat medium in one electronic device array is different from the flow rate of the heat medium in the other electronic device array. At this time, the abnormality detection unit 140 may detect an abnormality when the flow rate of the heat medium in one electronic device array is different from the estimated average value, median value, or mode of the flow rate by a predetermined value or more. At this time, the abnormality detection unit 140 may calculate an average value, a median value, or a mode of the flow rate from a plurality of electronic device arrays excluding one electronic device array. As described above, when there is an electronic device array having a different estimated flow rate from other electronic device arrays among the plurality of electronic device arrays, the abnormality detection unit 140 may detect that an abnormality has occurred in the electronic device arrays having different estimated flow rates.

The output unit 130 may output that the abnormality is detected by the abnormality detection unit 140 using the display, the speaker, the lamp, and the like described above.

When the abnormality detection unit 140 detects that an abnormality has occurred, the specification unit 150 specifies the module in which the abnormality has occurred. In this case, for example, the acquisition unit 110 may acquire the calorific values of all the modules included in the information processing device 200. Then, the specification unit 150 specifies a module having a different calorific value among the plurality of modules as a module in which an abnormality has occurred. At this time, for example, in a case where the calorific value of one module is different from an average value, a median value, or a mode of the calorific values of the modules included in the information processing device 200 by a predetermined value or more, the specification unit 150 may specify one module as the module in which the abnormality has occurred. At this time, the specification unit 150 may calculate an average value, a median value, or a mode of the calorific value from a plurality of modules excluding one module. In this manner, the specification unit 150 specifies the module in which the abnormality has occurred based on the acquired calorific value. The specification unit 150 is an example of a specification means.

The method of specifying the module in which the abnormality has occurred is not limited to this example. For example, the acquisition unit 110 may acquire the calorific value of the module included in the electronic device array 10 in which the occurrence of the abnormality is detected. Then, the specification unit 150 may specify the module in which the abnormality has occurred based on the calorific value of the module included in the electronic device array in which the occurrence of the abnormality is detected.

The output unit 130 may output information indicating the specified module using the above-described display, speaker, lamp, and the like.

[Operation of Flow-Rate Monitoring Device 101]

Next, an example of the operation of the flow-rate monitoring device 101 will be described with reference to FIG. 10. In the present operation example, it is assumed that a plurality of electronic device arrays 10 are mounted in the information processing device 200.

Figure 10:
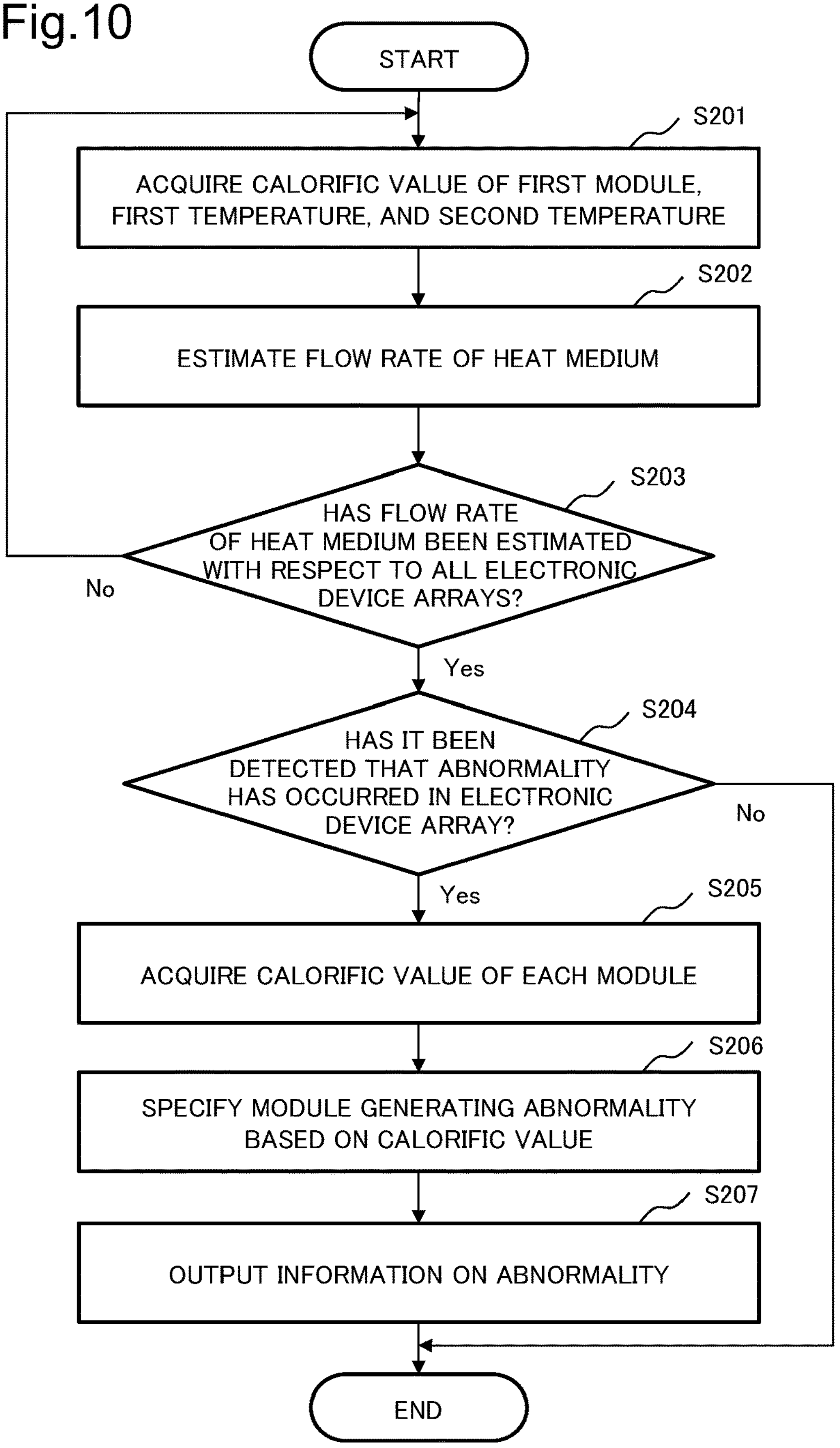
FIG. 10 is a flowchart illustrating an example of operation of a flow-rate monitoring device according to the second example embodiment of a modification of the present disclosure.

FIG. 10 is a flowchart illustrating an example of the operation of the flow-rate monitoring device 101. The processing of S201 to S203 is similar to the processing of S101 to S103 of FIG. 7. When the flow-rate monitoring device 101 estimates the flow rate of the heat medium for all the electronic device arrays 10 ("Yes" in S203), the process of S204 is performed. That is, the abnormality detection unit 140 determines whether an abnormality has occurred in the electronic device array 10. When the abnormality detection unit 140 does not detect the occurrence of the abnormality in the electronic device array 10 ("No" in S204), the flow-rate monitoring device 101 ends the process.

When the abnormality detection unit 140 detects that an abnormality has occurred in the electronic device array 10 ("Yes" in S204), the acquisition unit 110 acquires the calorific value of each module (S205). Then, the specification unit 150 specifies the module in which the abnormality has occurred based on the acquired calorific value. The output unit 130 outputs information regarding the abnormality. For example, the output unit 130 outputs information indicating that an abnormality is detected by the abnormality detection unit 140 and information indicating the specified module as information regarding the abnormality.

As described above, the flow-rate monitoring device 101 of the second example embodiment detects the occurrence of abnormality based on the estimated flow rate. Specifically, when the estimated flow rate is less than a predetermined threshold, the flow-rate monitoring device 101 detects that an abnormality has occurred in the electronic device array having the flow rate less than the predetermined threshold. As a result, for example, it is possible to notify that an abnormality has occurred in the flow path of the heat medium in the electronic device array. In a case where a plurality of electronic device arrays are mounted on the information processing device, when there is an electronic device array having a different estimated flow rate from other electronic device arrays among the plurality of electronic device arrays, the flow-rate monitoring device 101 may detect that an abnormality has occurred in the electronic device arrays having different estimated flow rates. As a result, the flow-rate monitoring device 101 can notify which electronic device array among the plurality of electronic device arrays has an abnormality.

The flow-rate monitoring device 101 of the second example embodiment specifies a module in which an abnormality has occurred. Specifically, in a case where the occurrence of the abnormality in the electronic device array is detected, the flow-rate monitoring device 101 acquires a calorific value of a module included in the information processing device, and specifies the module in which the abnormality has occurred based on the acquired calorific value. As a result, the flow-rate monitoring device 101 can notify which one of the modules included in the information processing device has an abnormality. At this time, the flow-rate monitoring device 101 may acquire the calorific value of the module included in the electronic device array in which the occurrence of the abnormality is detected, and specify the module in which the abnormality has occurred based on the calorific value of the module included in the electronic device array in which the occurrence of the abnormality is detected. As a result, since the flow-rate monitoring device 101 does not need to process the information of the calorific values of all the modules, the processing load can be reduced.

<Hardware Configuration Example of Flow-Rate Monitoring Device>

Figure 11:
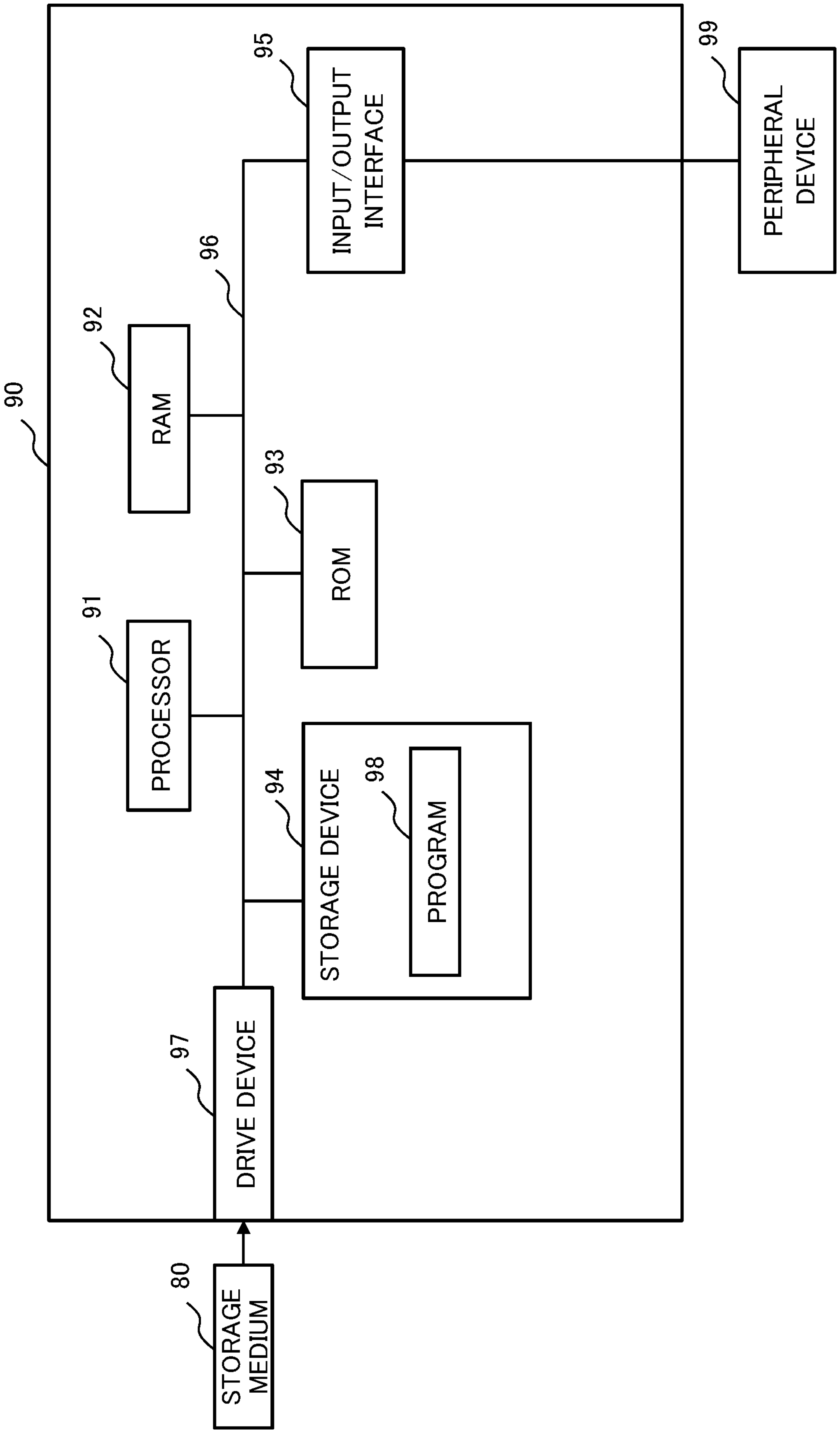
FIG. 11 is a block diagram illustrating an example of a hardware configuration of a computer device that implements the flow-rate monitoring devices according to the first and second example embodiments of the present disclosure.

Hardware constituting the flow-rate monitoring devices of the first and second example embodiments will be described. FIG. 11 is a block diagram illustrating an example of a hardware configuration of a computer device that implements the flow-rate monitoring device according to each example embodiment. In a computer device 90, the flow-rate monitoring device and the flow-rate monitoring method described in each example embodiment and each modification are achieved.

As illustrated in FIG. 11, the computer device 90 includes a processor 91, a random access memory (RAM) 92, a read only memory (ROM) 93, a storage device 94, an input/output interface 95, a bus 96, and a drive device 97. The flow-rate monitoring device may be implemented by a plurality of electric circuits.

The storage device 94 stores a program (computer program) 98. The processor 91 executes the program 98 of the flow-rate monitoring device using the RAM 92. Specifically, for example, the program 98 includes a program that causes a computer to execute the processing described in FIGS. 4, 7, and 10. The processor 91 executes the program 98 to implement the functions of the components of the present flow-rate monitoring device. The program 98 may be stored in the ROM 93. The program 98 may be recorded in the storage medium 80 and read using the drive device 97, or may be transmitted from an external device (not illustrated) to the computer device 90 via a network (not illustrated).

The input/output interface 95 exchanges data with a peripheral device (keyboard, mouse, display, etc.) 99. The input/output interface 95 functions as a means for acquiring or outputting data. The bus 96 connects the components There are various modifications of the method of implementing the flow-rate monitoring device. For example, the flow-rate monitoring device can be implemented as a dedicated device. The flow-rate monitoring device can be implemented based on a combination of a plurality of devices.

Processing methods for causing a storage medium to record a program for implementing components in a function of each example embodiment, reading the program recorded in the storage medium as a code, and executing the program in a computer are also included in the scope of each example embodiment. That is, a computer-readable storage medium is also included in the scope of each example embodiment. A storage medium in which the above-described program is recorded and the program itself are also included in each example embodiment.

The storage medium is, for example, a floppy (registered trademark) disk, a hard disk, an optical disk, a magneto-optical disk, a compact disc (CD)-ROM, a magnetic tape, a nonvolatile memory card, or a ROM, but is not limited to this example. The program recorded in the storage medium is not limited to a program that executes processing alone, and programs that operate on an operating system (OS) to execute processing in cooperation with other software and functions of an extension board are also included in the scope of each example embodiment.

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims.

This application is based upon and claims the benefit of priority from Japanese patent application No. 2021-086319, filed on May 21, 2021, the disclosure of which is incorporated herein in its entirety by reference.

REFERENCE SIGNS LIST

1, 2 module
3 distribution pipe
4 junction pipe
5, 6 connection pipe
11, 21 electronic circuit board
12, 22 heat generation member
13, 23 cooling member
14, 24 power measurement unit
15, 25 temperature measurement unit
31 supply pipe
32 Intermediate pipe
41 discharge pipe
100, 101 flow-rate monitoring device
110 acquisition unit
120 estimation unit
130 output unit
140 abnormality detection unit
150 specification unit
200 information processing device
1000 flow-rate monitoring system

What is claimed is:

1. A flow-rate monitoring device comprising:

one or more memories storing instructions; and one or more processors configured to execute the instructions to:

acquire a calorific value of a first module, a first temperature that is a temperature of a heat generation member of the first module, and a second temperature that is a temperature of the heat generation member of a second module, wherein the first module and the second module are included in a plurality of modules mounted on an information processing device, and wherein the each module includes an electronic circuit board and a cooling member, and wherein a heat medium discharged from the cooling member of the first module is supplied to the second module;

estimate a flow rate of the heat medium supplied to the first module based on the calorific value of the first module, the first temperature, and the second temperature;

when the heat medium discharged from the cooling member of the first module passes through a pipe and is supplied to the cooling member of the second module in an electronic device array showing a configuration in which the first module and the second module are connected in series by the pipe, estimate the flow rate of the heat medium flowing in the electronic device array for each of the electronic device arrays; and when a plurality of the electronic device arrays are mounted on the information processing device, detect that an abnormality has occurred in an electronic device array having a different estimated flow rate when there is an electronic device array having a different estimated flow rate from other electronic device arrays among the plurality of electronic device arrays.

2. The flow-rate monitoring device according to claim 1, wherein the one or more processors are configured to execute the instructions to:

when the estimated flow rate is less than a predetermined threshold, detect that an abnormality has occurred in the electronic device array having the flow rate less than the predetermined threshold.

3. The flow-rate monitoring device according to claim 2, wherein the one or more processors are configured to execute the instructions to:

when it is detected that an abnormality has occurred in the electronic device array, acquire a calorific value of the module included in the information processing device, and specify the module in which an abnormality has occurred based on an acquired calorific value.

4. The flow-rate monitoring device according to claim 3, wherein the one or more processors are configured to execute the instructions to:

when it is detected that an abnormality has occurred in the electronic device array, acquire a calorific value of the module included in the electronic device array in which occurrence of an abnormality is detected, and specify the module in which an abnormality has occurred based on a calorific value of the module included in the electronic device array in which occurrence of an abnormality has been detected.

5. The flow-rate monitoring device according to claim 1, wherein the first module and the second module are devices having an identical calorific value, and the one or more processors are configured to execute the instructions to:

acquire a calorific value acquired from either the first module or the second module as a calorific value of the first module.

6. A flow-rate monitoring method comprising:

acquiring a calorific value of a first module, a first temperature that is a temperature of a heat generation member of the first module, and a second temperature that is a temperature of the heat generation member of a second module, wherein the first module and the second module are included in a plurality of modules mounted on an information processing device, and wherein the each module includes an electronic circuit board and a cooling member, and wherein a heat medium discharged from the cooling member of the first module is supplied to the second module;

estimating a flow rate of the heat medium supplied to the first module based on the calorific value of the first module, the first temperature, and the second temperature;

when the heat medium discharged from the cooling member of the first module passes through a pipe and is supplied to the cooling member of the second module in an electronic device array showing a configuration in which the first module and the second module are connected in series by the pipe, estimating the flow rate of the heat medium flowing in the electronic device array for each of the electronic device arrays; and when a plurality of the electronic device arrays are mounted on the information processing device, detecting that an abnormality has occurred in an electronic device array having a different estimated flow rate when there is an electronic device array having a different estimated flow rate from other electronic device arrays among the plurality of electronic device arrays.

7. A computer-readable storage medium having stored therein a program causing a computer to execute:

acquiring a calorific value of a first module, a first temperature that is a temperature of a heat generation member of the first module, and a second temperature that is a temperature of the heat generation member of a second module, wherein the first module and the second module are included in a plurality of modules mounted on an information processing device, and wherein the each module includes an electronic circuit board and a cooling member, and wherein a heat medium discharged from the cooling member of the first module is supplied to the second module;

estimating a flow rate of the heat medium supplied to the first module based on the calorific value of the first module, the first temperature, and the second temperature;

when the heat medium discharged from the cooling member of the first module passes through a pipe and is supplied to the cooling member of the second module in an electronic device array showing a configuration in which the first module and the second module are connected in series by the pipe, estimating the flow rate of the heat medium flowing in the electronic device array for each of the electronic device arrays; and when a plurality of the electronic device arrays are mounted on the information processing device, detecting that an abnormality has occurred in an electronic device array having a different estimated flow rate when there is an electronic device array having a different estimated flow rate from other electronic device arrays among the plurality of electronic device arrays.

* * * * *